US012796323B2

(12) United States Patent
Johnson

(10) Patent No.: US 12,796,323 B2
(45) Date of Patent: *Nov. 10, 2026

(54) JOHNSON AMBIENT ENERGY CONVERTER

(71) Applicant: Johnson IP Holding, LLC, Atlanta, CA (US)

(72) Inventor: Lonnie G. Johnson, Atlanta, GA (US)

(73) Assignee: Johnson IP Holding, LLC, Atlanta, GA (US)

( * ) Notice: Subject to any disclaimer, the term of this patent is extended or adjusted under 35 U.S.C. 154(b) by 862 days.

This patent is subject to a terminal disclaimer.

(21) Appl. No.: 18/108,897

(22) Filed: Feb. 13, 2023

(65) Prior Publication Data

US 2023/0189648 A1 Jun. 15, 2023

Related U.S. Application Data

(63) Continuation-in-part of application No. 17/154,769, filed on Jan. 21, 2021, now Pat. No. 11,581,599.

(51) Int. Cl.

*H10N 10/13* (2023.01)
*H10N 10/813* (2023.01)
*H10N 10/85* (2023.01)

(52) U.S. Cl.

CPC .......... *H10N 10/13* (2023.02); *H10N 10/813* (2023.02); *H10N 10/85* (2023.02)

(58) Field of Classification Search

CPC ...... H10N 10/13; H10N 10/813; H10N 10/85; H01M 8/04007; H01M 8/04029; H01M 8/04119; H01M 8/0668; Y02E 60/50

See application file for complete search history.

(56) References Cited

U.S. PATENT DOCUMENTS

| | | | | |
|---|---|---|---|---|
| 11,581,599 B2 * | 2/2023 | Johnson | H01M 14/00 | |
| 2012/0028164 A1 * | 2/2012 | Lee | H01M 4/405 | 429/479 |
| 2014/0178777 A1 * | 6/2014 | Lee | H01M 4/366 | 429/405 |
| 2020/0212436 A1 * | 7/2020 | Liu | B60L 50/64 | |

* cited by examiner

*Primary Examiner* — Adam A Arciero

(74) *Attorney, Agent, or Firm* — Baker, Donelson, Bearman, Caldwell & Berkowitz PC

(57) ABSTRACT

An ambient energy converter includes a housing having an upper portion and a lower portion. The housing lower portion has a hydrophobic material portion. The upper portion has a vent opening in fluid communication with ambience. The housing contains a mass of hygroscopic within the housing lower portion that is in fluid communication with the hydrophobic material portion. An ion conductive membrane electrode assembly is coupled to the housing to allow the passage of ionized water or water vapor through the ion conductive membrane electrode and into contact with the hygroscopic solution. An air conduit may be coupled to the housing to provide an airflow to the ion conductive membrane electrode and/or hydrophobic material portion.

18 Claims, 15 Drawing Sheets

0.13kpa/mm

9mm 1.17kpa at 14°C, 75% Relative Humidity 9.5mm = 1.235kpa at 28°C, 35% Relative Humidity

JOHNSON AMBIENT ENERGY CONVERTER

REFERENCE TO RELATED APPLICATION

This is a continuation-in-part of U.S. Non-Provisional patent application Ser. No. 17/154,769 filed Jan. 21, 2021 and entitled "Johnson Ambient Energy Converter, which Applicant claimed the benefit of U.S. Provisional Patent Application Ser. No. 62/975,502 filed Feb. 12, 2020 and entitled "Johnson Ambient Energy Converter".

TECHNICAL FIELD

This invention relates generally to a system for converting thermal energy to electrical energy.

BACKGROUND OF INVENTION

It has long been a goal to develop an engine that can harvest thermal energy that is freely available in the ambient environment. In conventional thermoelectric convertors and conventional devices that operate on a thermodynamic cycle, a heat source and a heat sink are employed and occur simultaneously. They require a simultaneous temperature differential for operation. Attempts have been made to utilize thermal insulation material and a heat sink to impose the needed temperature differential. One section of the converter is thermally insulated from the environment and/or coupled to a high heat capacity material so as to delay changes in its temperature relative to temperature changes in its environment. The lag in temperature changes relative to the section that is exposed and thermally coupled to the environment creates the required temperature differential needed for the thermoelectric converter to operate. However, the need to include a heat capacity material and thermal insulation limits the practicality of such converters. Further, conversion effectiveness decreases as parasitic heat conduction through the device's structure becomes more and more overwhelming as the size of the device is reduced.

Accordingly, it is seen that a need remains for an energy converter that may operate in ambience for generating electricity. It is to the provision of such therefore that the present invention is primarily directed.

DETAILED DESCRIPTION

The present invention can be driven by the normal temperature and humidity transients that naturally occur in the ambient environment. Its operating principal is based on the thermo-galvanic effect wherein the voltage of an electrochemical cell is a direct function of its temperature and reactant concentration differentials. As required in any thermodynamic cycle, a heat source and a heat sink are employed; however; different from a typical thermodynamic engine, the heat source and heat sink do not occur simultaneously. Ideally, when operating on ambient energy, the entire ambient energy converter maintains a state of thermal equilibrium with its environment.

Figure 1:
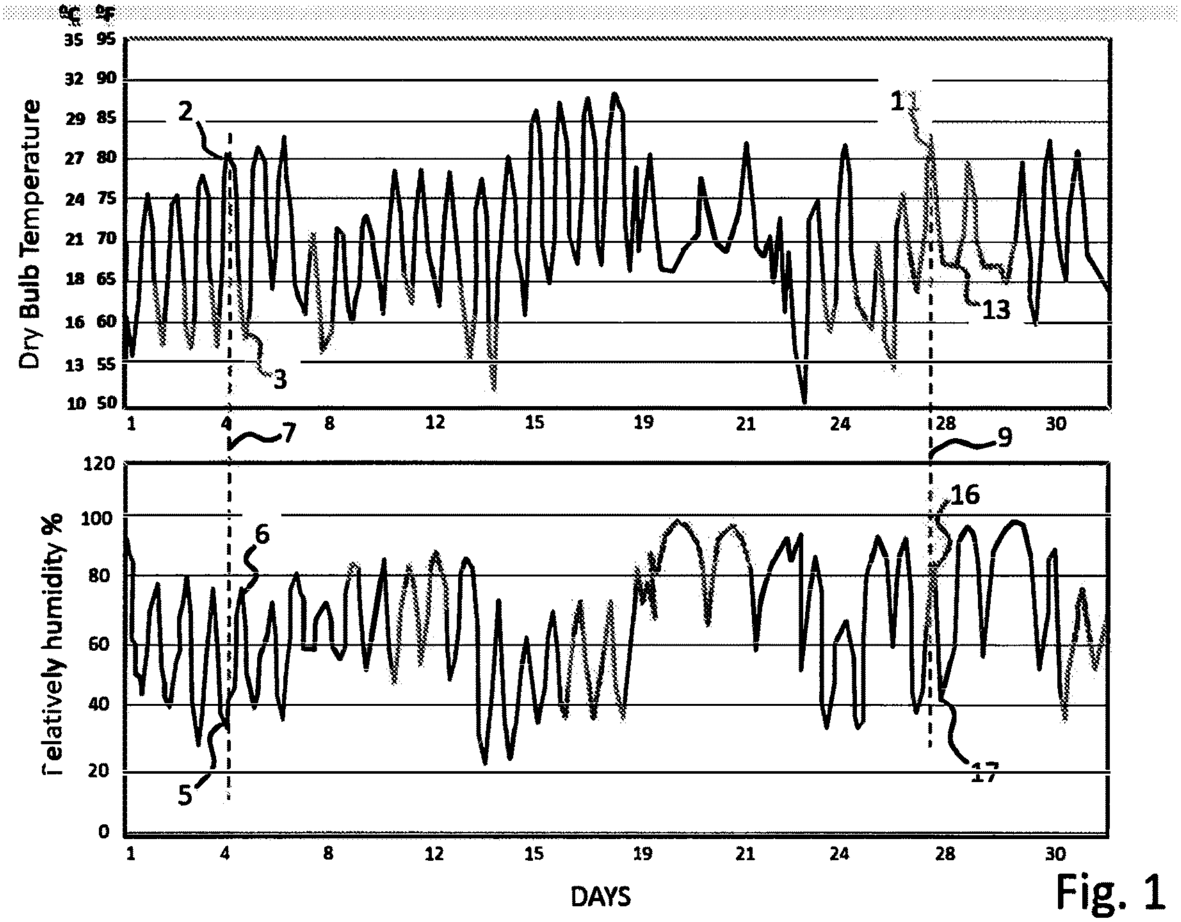
FIG. 1 is a representative graph illustrating variations in temperature and humidity for a randomly selected location and 30 day period.
Figure 1A:
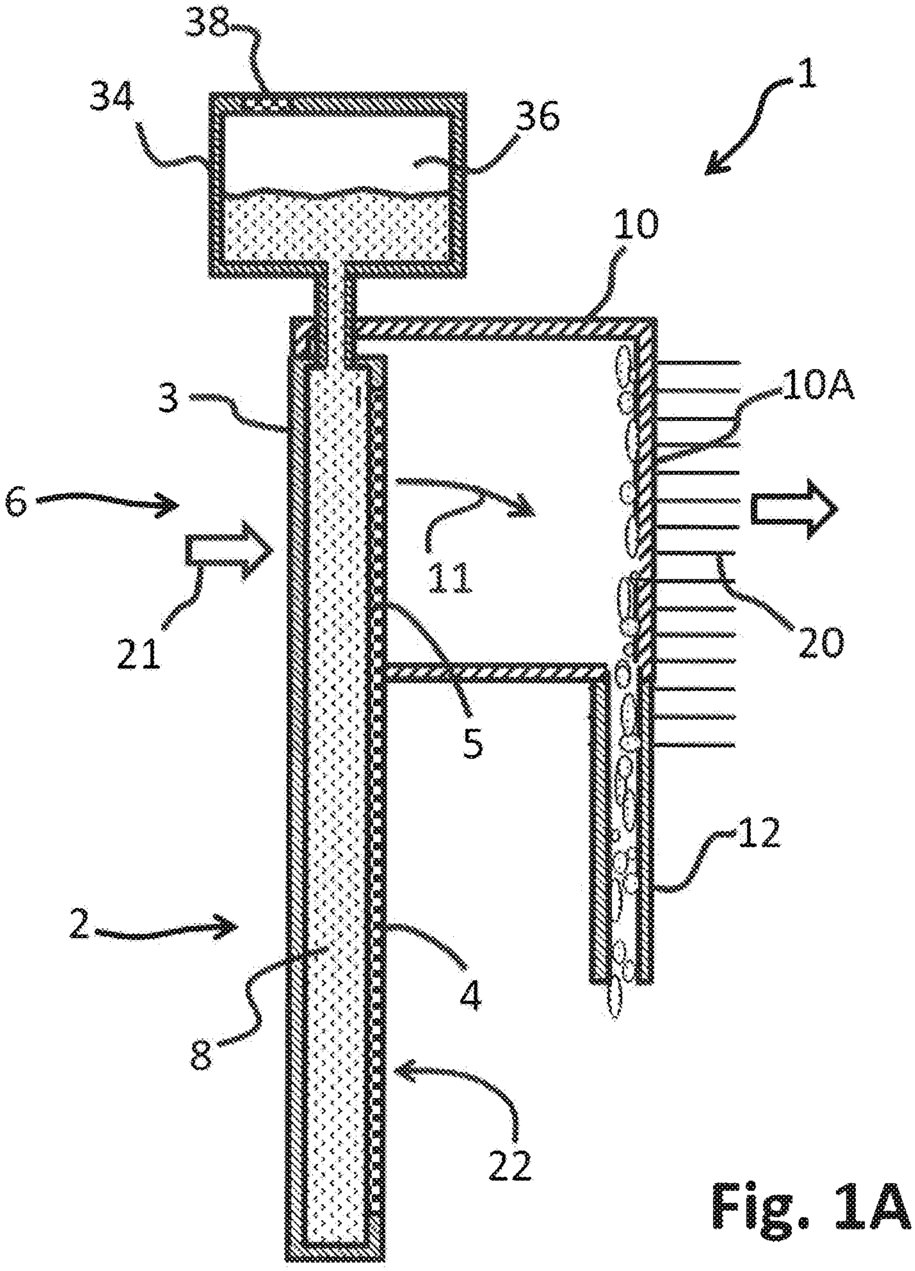
FIG. 1A is a schematic, cross-sectional view of an ambient water condenser utilized as a portion of the energy converter in a preferred form of the invention.

With reference next to the drawings, there is shown in FIG. 1A the basic ambient water condenser or condenser portion of an ambient energy converter or electrochemical heat to electrical power converter 1 in a preferred form of the invention, referenced hereinafter generally as ambient energy converter. The ambient energy converter 1 includes a condensation chamber 10 having exterior walls 10A which is fluidly coupled by membrane 5 to fluid within reservoir or housing 3. The condensation chamber 10 has a lower end which is coupled to and in fluid communication with a drip tube 12.

The housing 3 may include an ullage chamber 34 for accommodating changes in the overall water content equilibrium state of a hygroscopic electrolyte or solution 8. The ullage chamber 34 may be mechanically expandable or, as shown in FIG. 1A, it may include excess volume 36 that allows hygroscopic solution 8 to expand and contract as needed as its average water content varies with ambient humidity conditions. Ullage chamber 34 may also include vent port 38 to allow air passage to maintain total pressure equilibrium with ambience as the volume of hygroscopic solution 8 changes. Under high humidity conditions, hygroscopic solution 8 expands in volume as it absorbs water from the ambient air through hydrophobic membrane 4 to react to a point where hygroscopic solution 8 in the lower section 2 has a water vapor pressure that equals the water vapor partial pressure of ambient air. Conversely, during low humidity conditions, hygroscopic solution 8 contracts as water evaporates from it until the hygroscopic solution 8 reaches a water vapor pressure that equals the ambient air water vapor partial pressure. Ullage chamber 34 protects the ambient energy converter 1 under conditions of very high humidity where the hygroscopic solution 8 absorbs more water than could otherwise be contained within the housing 3.

The housing 3 has a housing lower or bottom section 2 and a housing upper or top section 6. The housing lower section 2 includes a portion which is a lower porous hydrophobic membrane 4, while the housing upper section 6 includes a portion which is an upper porous hydrophobic membrane 5. It should be understood that the upper and lower hydrophobic membranes may be a single hydrophobic membrane or piece of hydrophobic material extending between the lower section 2 and upper section 6.

The housing 3 contains a mass, supply, or quantity of aqueous hygroscopic solution 8 therein for condensing water from ambient air. A distillation process is used in the top section of the housing to extract the water from the solution. The hygroscopic solution may be a lithium bromide solution or other suitable hygroscopic solution. The hygroscopic solution 8 absorbs water vapor 22 from ambient air through the lower hydrophobic membrane 4 coupled to the housing lower section 2. The hygroscopic membrane may be a porous Teflon™ or hydrophobic porous Polyvinylidene Fluoride (PVDF). The nature of hydrophobic porous membranes 4 and 5 is such that the hygroscopic solution 8, being an aqueous liquid, does not wet or pass through the hydrophobic membrane's pores; however, a gas such as water in its vapor phase, freely passes through the hydrophobic membrane. Hence, hygroscopic membrane 4 allows water vapor to pass from ambience into the housing 3, but does not allow the liquid water to escape from the housing 3 in the opposite direction.

A heat source 21, which may be solar, electric, gas, etc., is coupled to the housing upper section 6. The heat source 21 heats the housing upper section 6 so that the hygroscopic solution 8 contained within the housing upper section absorbs the heat produced from the heat source 21.

The condensation chamber 10 is coupled to a thermal coupling 20, such as heat dissipating vanes. The thermal coupling 20 removes heat from the water 11 contained within the condensation chamber 10 through a heat sink. The condensed water 11 within the condensation chamber 10 may be removed from the condensation chamber 10 through drip tube 12.

With moisture absorption, the now low density hygroscopic solution 8 rises to the housing upper section 6 of the housing 3 wherein heat from the heat source 21 causes the evaporation of water from the hygroscopic solution 8 resulting in the water vapor passing through the upper porous hydrophobic membrane 5 and into the condensation chamber 10. The condensation chamber outer walls 10A are maintained at low temperature by thermal coupling 20 to the surrounding ambient air to promote condensation of the water vapor within the condensation chamber 10. The resulting dense, water depleted hygroscopic solution 8 migrates back to the housing lower section 2 wherein the hygroscopic solution 8 once again reabsorbs water vapor through the lower porous hydrophobic membrane 4*a* as the process repeatedly continues.

Referring next to FIG. 1, there is shown an arbitrarily selected representative example chart showing typical random variations in ambient temperature and relative humidity over a period of 30 days. As can be seen from the chart, typical variations are random in magnitude and random with respect to the time of day. In addition, temperature and humidity are random to each other with respect to their high and low points. For example, at event line 7 representing day 4, the humidity is low at point 5 with a value of 35% when the temperature is high at point 2 with a value of 28 degrees C., and when temperature transitions to low temperature at point 3 with a value of 14 degrees C., the humidity transitions to a high humidity at point 6 with a value of 75%. On the other hand, at event line 9 on day 27, the humidity is high at point 16 with a value of 85% and the temperature is high at point 11 with a value of 28 degrees C., and when temperature is low at point 13 with a value of 19 degrees C., the humidity is low as well at point 17 with a value of 40%. There relative direction and relative magnitudes are all random.

Figure 2:
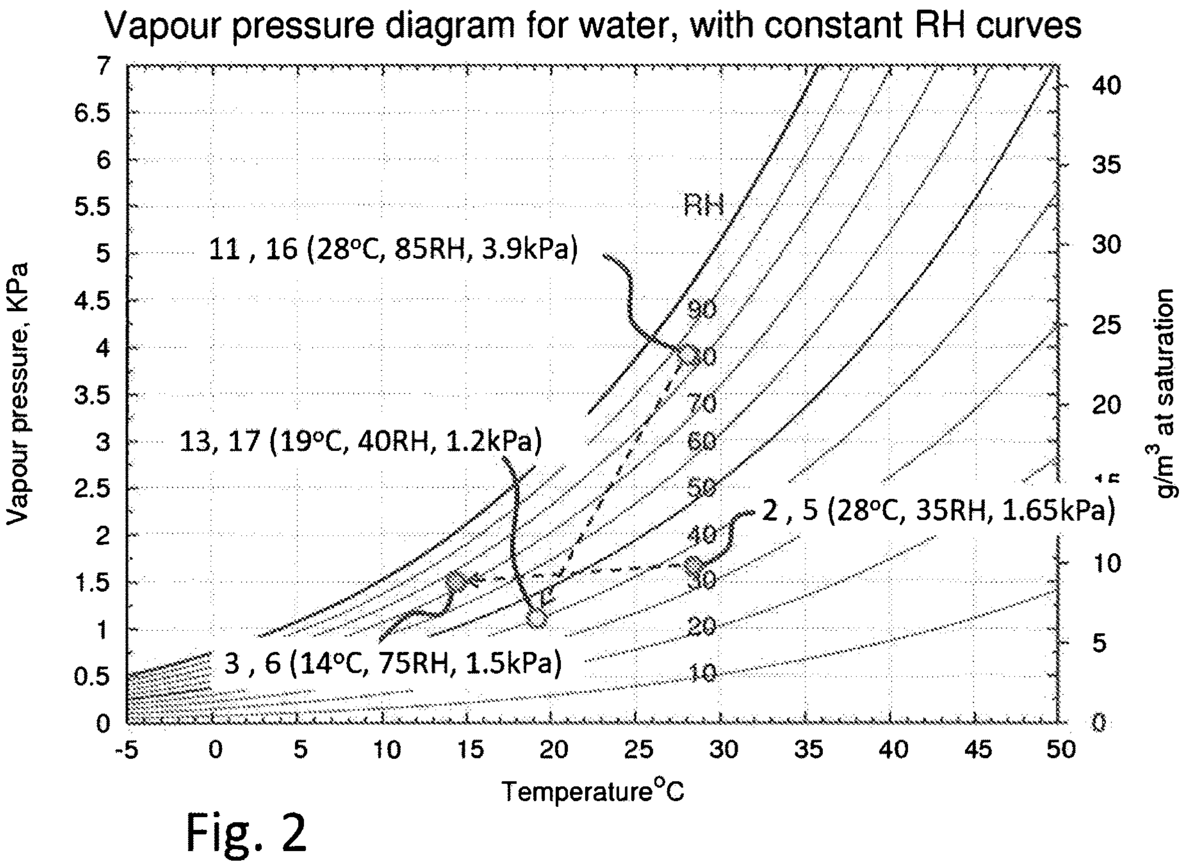
FIG. 2 is a graph illustrating the relationship between ambient water vapor pressure, temperature, relative humidity and grams of water per unit volume of air.

To benefit explanation, event line 7 is assigned transition coordinates from (2,5) to (3,6), and at event line 9 is assigned transition coordinates (11,16) to (13,17). These transition coordinates are plotted in FIG. 2 which shows the partial water vapor pressure in air as a function of the relative humidity and temperature. Event lines or transitions 7 and 9 selected from FIG. 1 are indicated as transition coordinates (2,5) to (3,6) and transition coordinates (11,16) to (13,17) respectively. The temperature and humidity values for these coordinates are taken from FIG. 1 are as indicated. FIG. 2 is used to further define the coordinates by adding the partial pressure of water vapor in air at the selected temperature and relative humidity points. Within the approximate resolution of the graph, at coordinate (2,5) the partial water vapor pressure in air is 1.65 KPa, at coordinate (3,6) the partial water vapor pressure is 1.5 kPa, at coordinate (11,16) the partial water vapor pressure in air is 3.9 kPa, and at coordinate (13,17) the partial water vapor pressure in air is 1.2 kPa.

It is well understood that certain salt solutions are naturally hygroscopic and have water vapor pressure that is a function of temperature and weight percent mass of salt dissolved in the solution. These solutions maintain equilibrium water vapor pressure with their environment by absorbing or releasing water. Lithium Bromide in water is representative of such solutions and is among the highest in its tendency to attract and become more dilute in the presence of water vapor.

Figure 3:
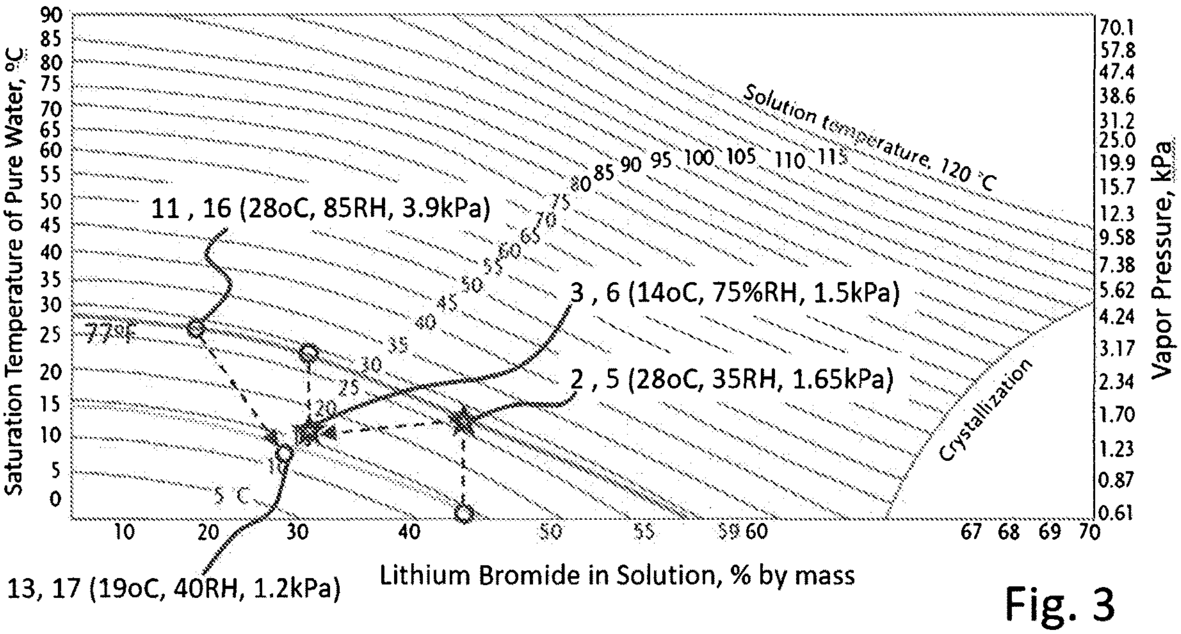
FIG. 3 is a graph of saturation temperature and vapor pressure vs the percent of mass of lithium bromide in water solution.

FIG. 3 is a chart of equilibrium water vapor pressure for lithium bromide water solution as a function of temperature and percent mass of lithium bromide in the solution. The previously shown selected example coordinates have been added to the chart in order to illustrate the transitions that must occur in a solution that is exposed to the example coordinates or transitions selected from FIG. 1. In FIG. 3, the water vapor partial pressure values from FIG. 2 are used to plot the example coordinate points on their respective temperature lines in order to identify the mass percent lithium bromide concentration needed for equilibrium. As can be seen from FIG. 3, starting with conditions at coordinate (2,5), the transition to coordinate (3,6) would require a decrease in concentration from 44% down to 31%. The water content starts at 56% and increases to 69%, a 23% increase. The transition from coordinates (11,16) to (13,17) requires an increase in concentration from 18.5% to 29%. Here the water content decreases from 82% down to 71%, a decrease of 13%.

Figure 4:
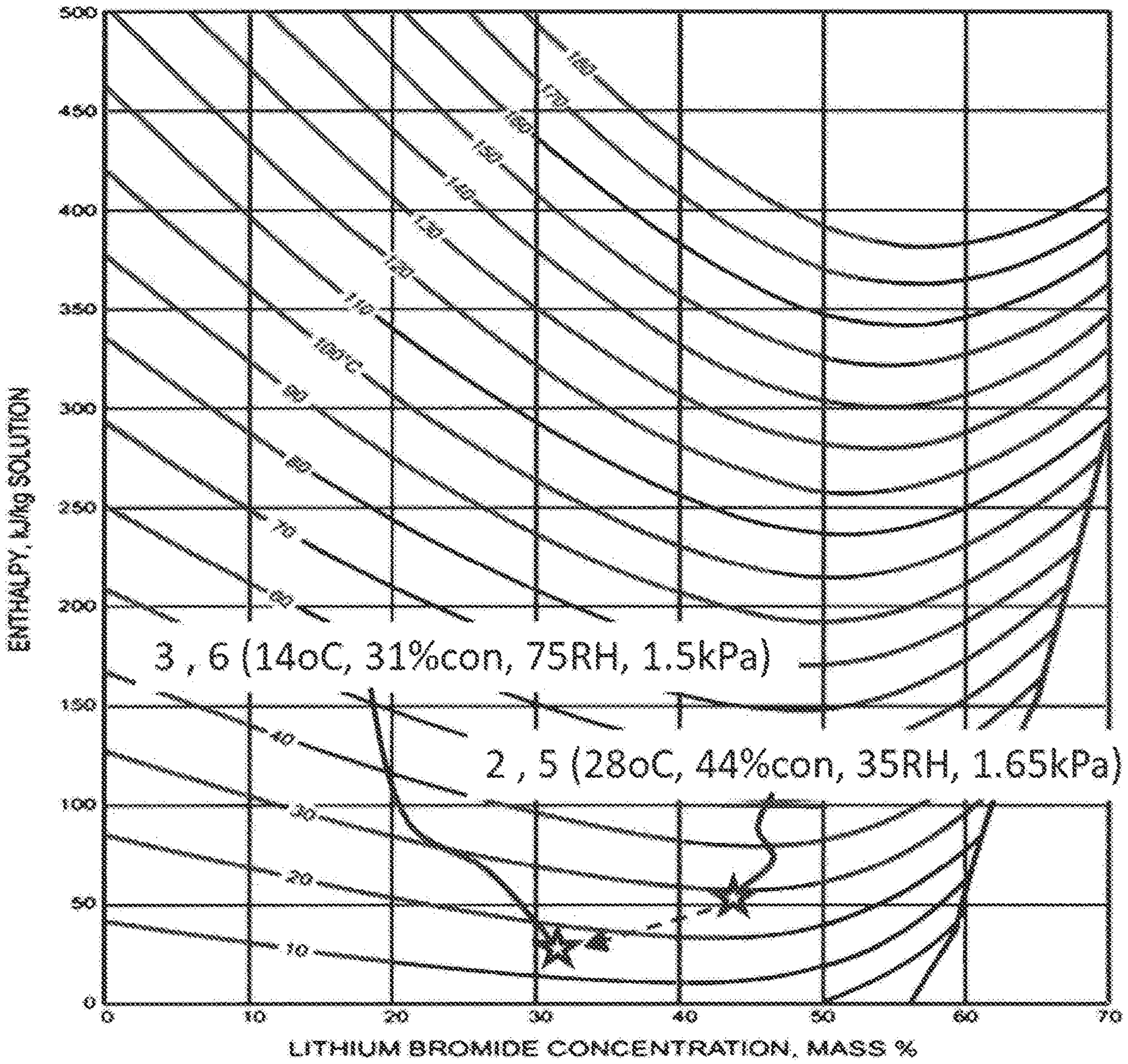
FIG. 4 is a graph illustrating the enthalpy vs temperature and mass percentage of lithium bromide in water solution for the coordinate 3,6 to coordinate 2,5 transient represented in FIG. 1.
Figure 5:
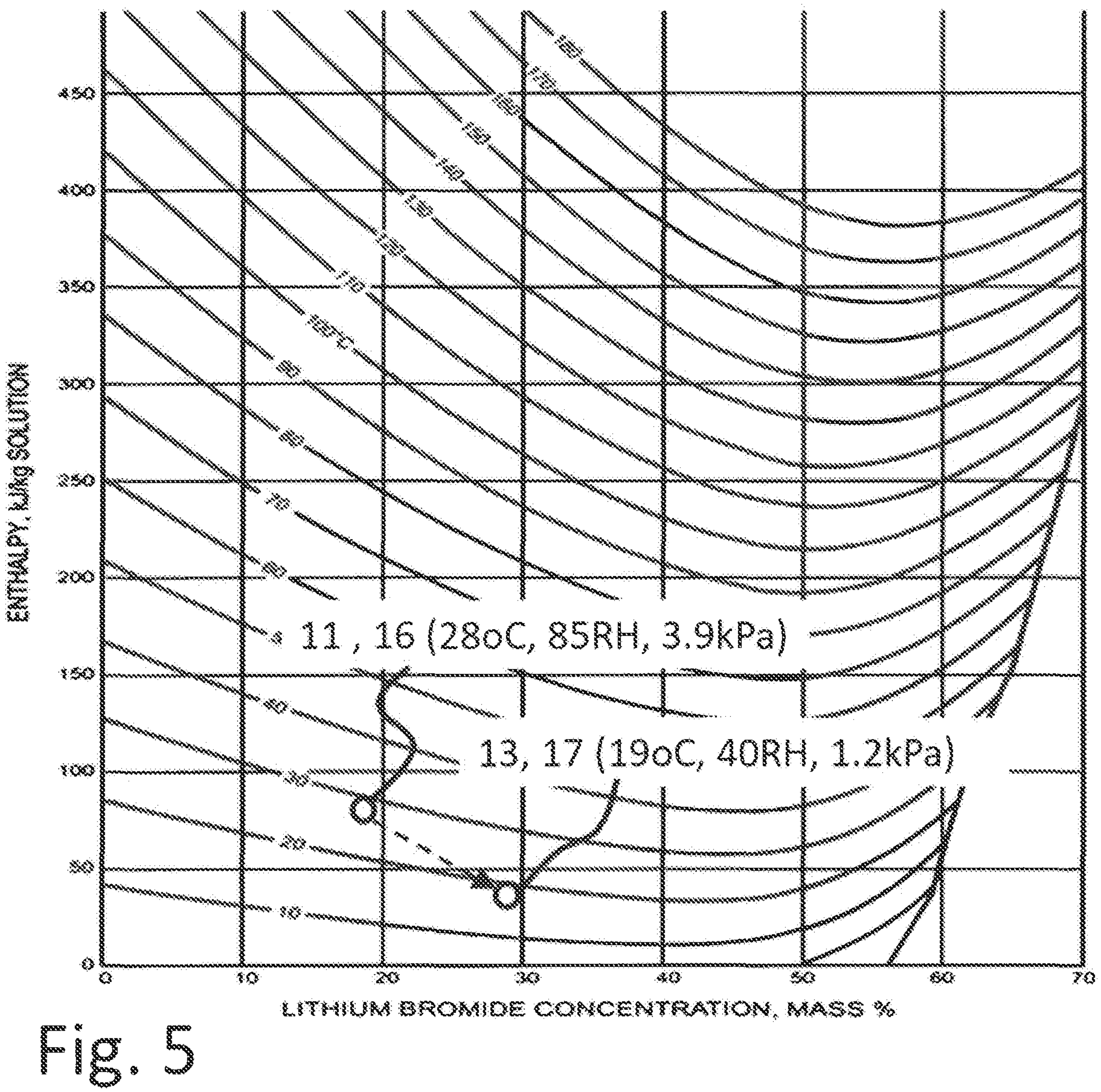
FIG. 5 is a graph illustrating the enthalpy vs temperature and mass percentage of lithium bromide in water solution for the coordinate 11,16 to coordinate 13,17 transient represented in FIG. 1.
Figure 5A:
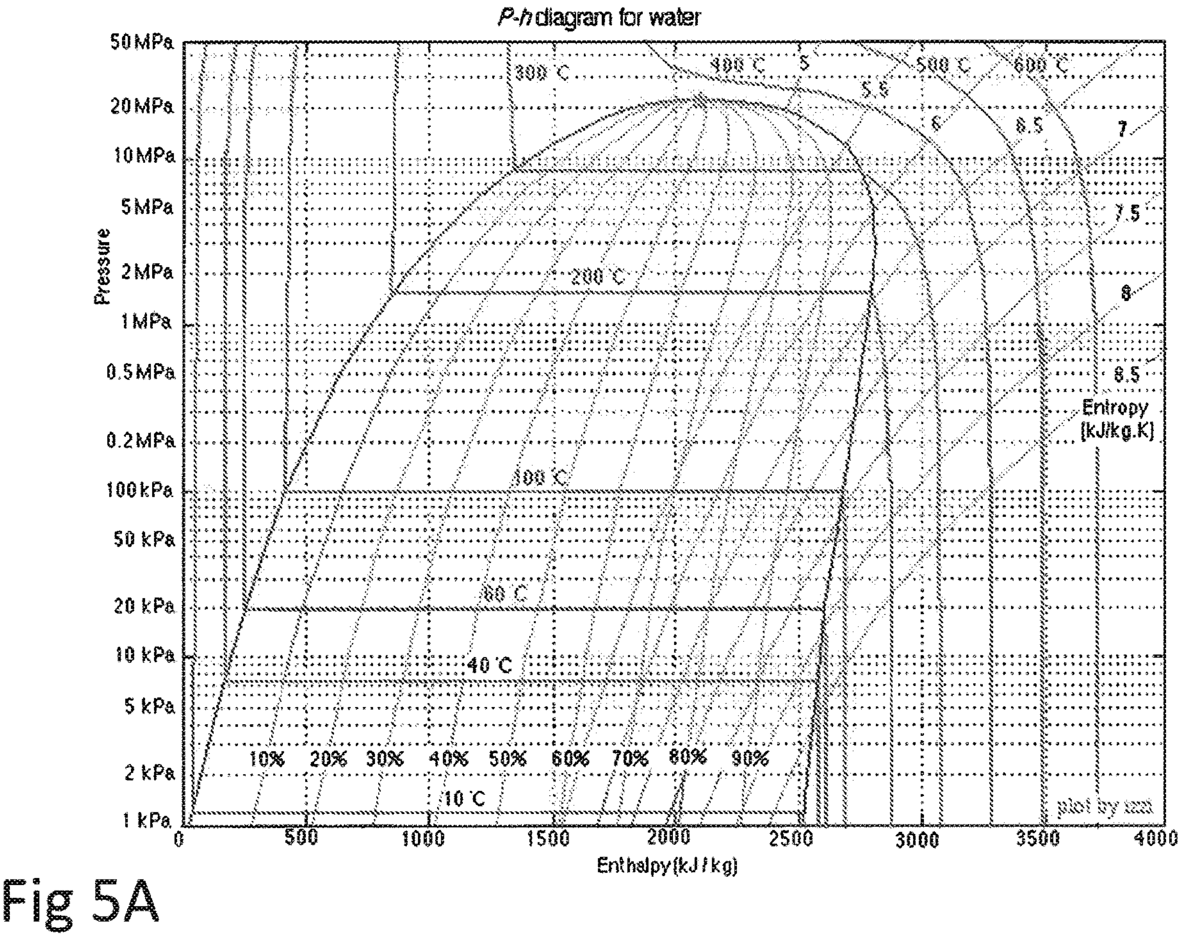
FIG. 5A is a graph illustrating the pressure vs the enthalpy and temperature of water.

With reference next to FIGS. 4 and 5, there is shown that the solution's change in enthalpy in both of these examples is on the order of 50 kJ/kg. Thus, a relatively small amount of change in net energy state of the solution after equilibrium in temperature and water vapor partial pressure is achieved. On the other hand, the energy of absorption and evaporation of the water from the solution is significantly higher, on the order of 2500 kJ/kg for water below 40 degrees C. condensing from a saturated vapor state to liquid, as shown by FIG. 5A.

Figure 6:
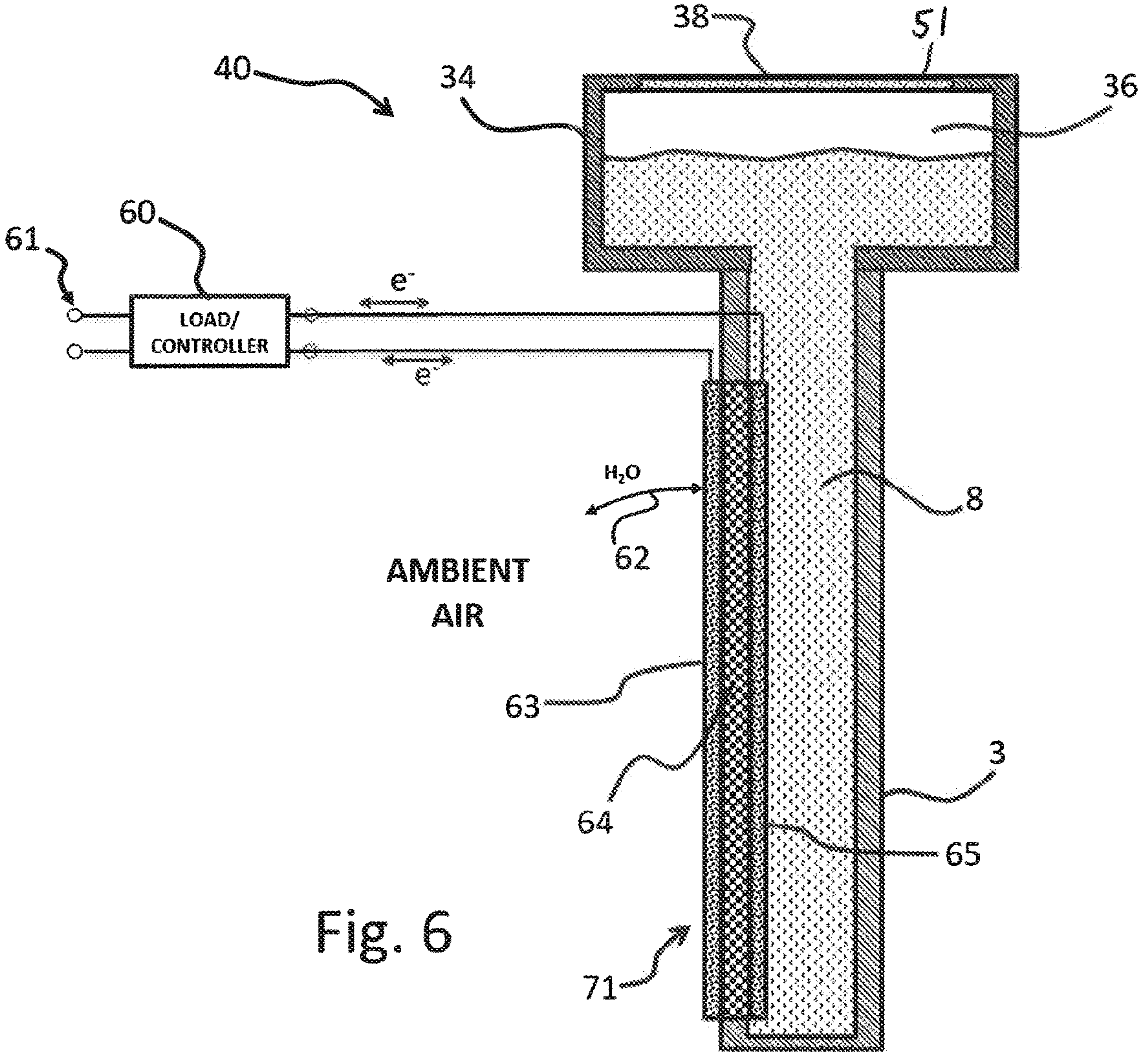
FIG. 6 is a schematic, cross-sectional view of an ambient energy converter in a preferred form of the invention.
Figure 7:
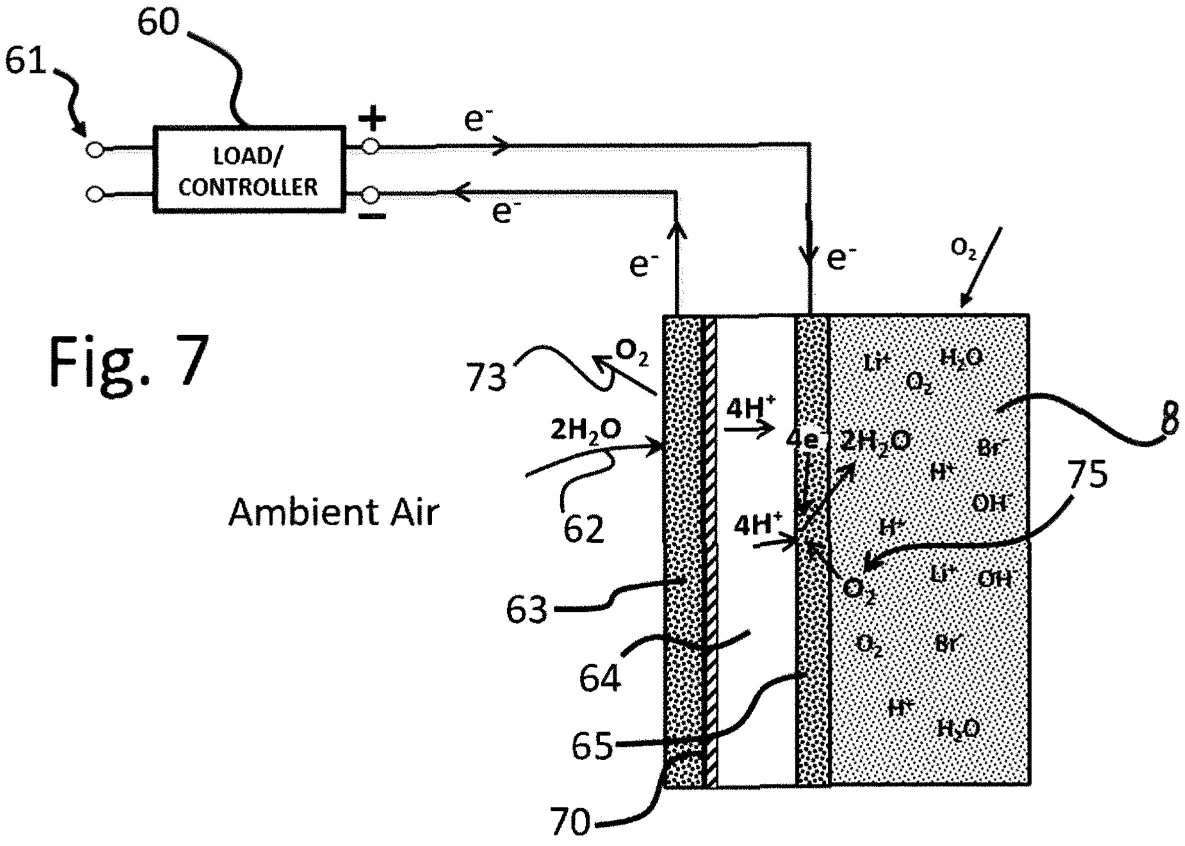
FIG. 7 is a schematic, cross-sectional view of a portion of the membrane electrode assemble component of the ambient energy converter of FIG. 6 showing electrolyzing of water into the hygroscopic solution.
Figure 8:
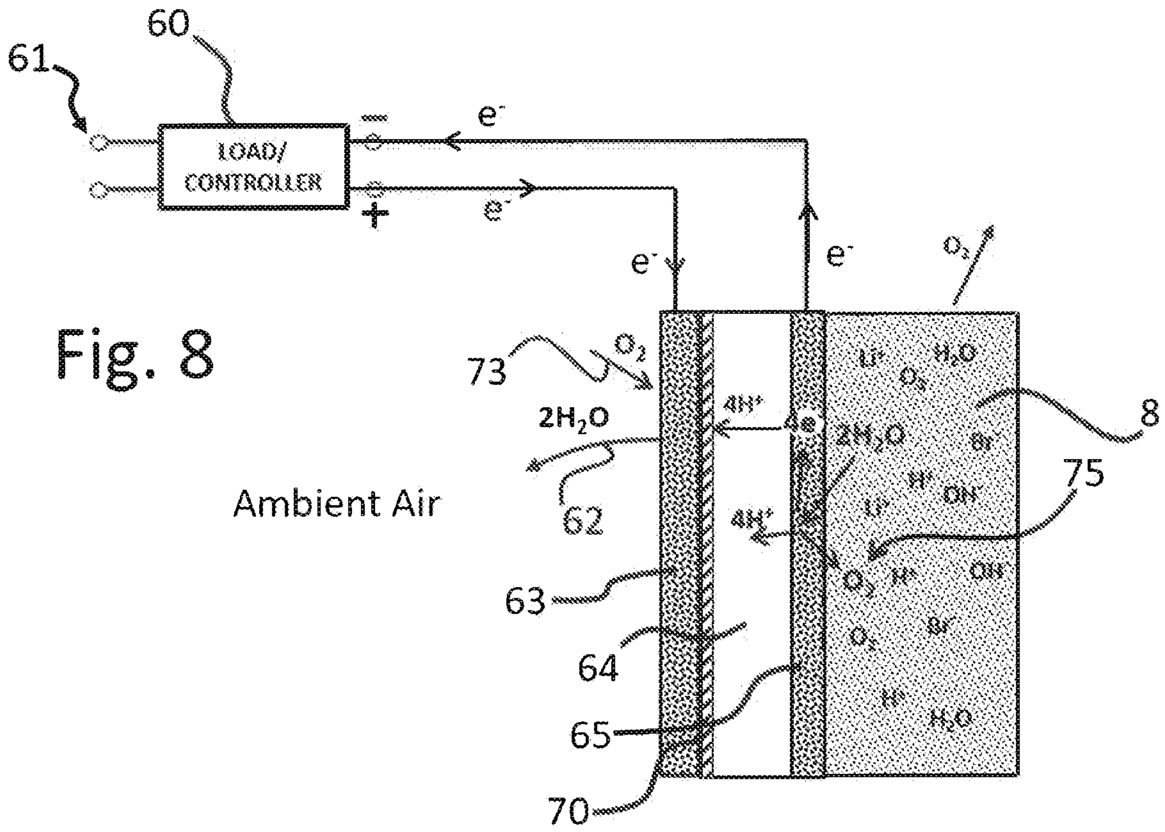
FIG. 8 is a schematic, cross-sectional view of a portion of the membrane electrode assemble component of the ambient energy converter of FIG. 6 showing electrolyzing of water out of the hygroscopic solution.

With reference next to FIGS. 6-8, there is shown an ambient energy converter 40 in a form of the invention. Here, the ambient energy converter 40 is configured to generate alternating current (AC) power with variations in atmospheric temperature and humidity.

The ambient energy converter 40 has a housing 3 containing a mass of hygroscopic solution 8. Housing 3 includes solution expansion (ullage) chamber or reservoir 34 having a vent port or opening 38 covered with a flexible diaphragm or air permeable membrane 51. Cover 51 may be an air permeable membrane whereby the mass of hygroscopic solution 8 is contained within the housing below the height or position of the port 38 upon the housing 3 so that air passes through the port 38 and into contact with the top surface of the hygroscopic solution 8. The excess volume 36 within the ullage chamber 34 is provided to accommodate changes in the equilibrium level of the hygroscopic solution 8 within the ambient energy converter 40 with changes in temperature and humidity of the surrounding environment. Alternatively, cover 51 may be a flexible cover that expands convexly or concavely to accommodate changes in hygroscopic solution 8's volume.

Hygroscopic solution 8 within the housing 3 is in fluid communication with the surrounding air or environment through ion or proton conductive high-water barrier membrane 64 of a membrane electrode assembly (MEA) 71. The ion conductive membrane 64 is sandwiched between electrodes 63 and 65. The combination of the ion conductive membrane 64 and electrodes 63 and 65 form the membrane electrode assembly 71. The membrane electrode assembly 71 is coupled to an external load or controller 60 having connectors 61, wherein electricity produced by the membrane electrode assembly 71 powers the external load or controller 60. The membrane electrode assembly 71 allows for the transfer of water vapor 62 through the membrane electrode assembly 71.

Operation is such that hygroscopic solution 8 is maintained in temperature equilibrium with the surrounding air by heat transfer via housing 3. The hygroscopic solution 8 is maintained in water vapor pressure equilibrium with the surrounding air by water oxidation reduction reactions through the membrane electrode assembly 71.

As shown in FIG. 7, during when the water partial pressure in the surrounding air is above the water pressure of hygroscopic solution 8, typically periods of high humidity, the pressure differential causes atmospheric water (water vapor) to be electrolyzed at electrode 63 with the resulting protons being conducted through ion conductive membrane 64, resulting oxygen 73 being released back to the surrounding air and the resulting electrons being routed to load/controller 60. The protons are conducted to electrode 65 where they are reduced by electrons flowing from load/controller 60 and react with dissolved oxygen 75 within hygroscopic solution 8 to make water within the hygroscopic solution 8. Power is thus supplied to the load/controller 60 with the hygroscopic solution's attraction for the water vapor driving the process. Ideally, ion conductive membrane 64 has high barrier properties and prevents condensation and migration of water molecules directly into the hygroscopic solution 8. A thin ion conductive barrier 70 is included to limit molecular migration of water through the oxidation/reduction process in order for hygroscopic solution 8 to absorb water. Proton conductive membrane materials, such as Nafion, made by and a trademark of E.I. DuPont De Nemours and Company, are themselves hygroscopic and require water as a necessary component to promote ion conduction. Ion conductive barrier 70 prevents water from condensing directly into the conductive membrane and subsequently migrating into the hygroscopic solution 8 as a molecule. The thin ion barrier layer 70 may be a hydrogen permeable material such as palladium or a high molecular water barrier proton conductive material such as ceramic yttrium-doped barium zirconate, $YBaZrO_3$ or Titanium Dioxide, $TiO_2$ A high molecular water barrier ceramic proton material such as TiO2 may be used exclusively as membrane 64 since it would have both the high barrier and proton conductive properties needed. The processes conveyed by FIG. 7 amounts to an electrochemical oxidation reduction process that is equivalent to condensing or, in effect or effectively condenses, water into the solution under the water vapor pressure differential between the solution and the ambient air. FIG. 8 conveys the reverse electrochemical oxidation reduction process that is equivalent to evaporating or, in effect or effectively evaporate, water from the solution under the water vapor pressure differential between the solution and the ambient air. With reference to FIG. 8, when the ambient water vapor pressure is below the water vapor pressure of the hygroscopic solution 8. Under this condition, the higher water vapor pressure of the hygroscopic solution drives the oxidation of the water at electrode 65 with oxygen 75 being released back into the water. Electrons are routed to load 60 to electrode 63 as the protons are conducted through membrane 64 with oxygen being released back into hygroscopic solution 8. Protons conducted through membrane 64 are reduced by electrons from load 60 and react with oxygen from the external air with the resulting water being released to the environment.

The cell voltage is defined primarily by the condensation entropy of water as:

$$\Delta V = \Delta S/2F = 2500j/(g2F) = 0.233\text{V}.$$

It is reasonable to assume that a cell would undergo water vapor absorption followed by evaporation each day, presumably over a 24 hour period. FIGS. 3, 4, and 5, suggest water absorption/desorption at an average level of 15% of the mass of the solution per half daily cycle (0.15 g of water absorbed and then desorbed per gram of solution per daily cycle). Table 1 presents an example half day power generation transient. It provides insight into the power density available from the invention. The 15% absorption of water generates 1600 coulombs of electrons per gram as given by:

$$C = nAEm/MW.$$

Where n is the number of electrons involved in the process (2 per water molecule), A is Avogadro's number (6.02e23), E is the charge on a single electron (1.602e-19) and MW is the molecular weight water, 18 g. The charge at 0.15 grams of water per gram of solution per half cycle:

| |
|---|
| I = 2*6.03*1023*1.602*1019*0.15 g/transient/gsol(1 cm3*18 g/mole) = 1607.34 coulombs/$g_{sol}$ |

Substituting the values yields 1607 Coulombs per gram. At 0.233 Volts, the resulting equivalent capacity is 104 mWh/$g_{sol}$ per half day cycle or 208 mWh/$g_{sol}$ per full daily absorption desorption cycle for each gram of hygroscopic salt solution in the device on average from the representative daily temperature and humidity cycles given presented in FIG. 1. This is equivalent to 208 Wh/kg which is the capacity of a state of the art lithium ion battery cell.

TABLE 1

| | |
|---|---|
| Volts= | 0.233192 |
| Coulombs= | 1607.34 |
| Amp hours= | 0.446483 |
| W · sec= | 374.5102 |
| Wh= | 0.104031 |
| Avg. 12 Hour Power= | 0.008669 |

Figure 9:
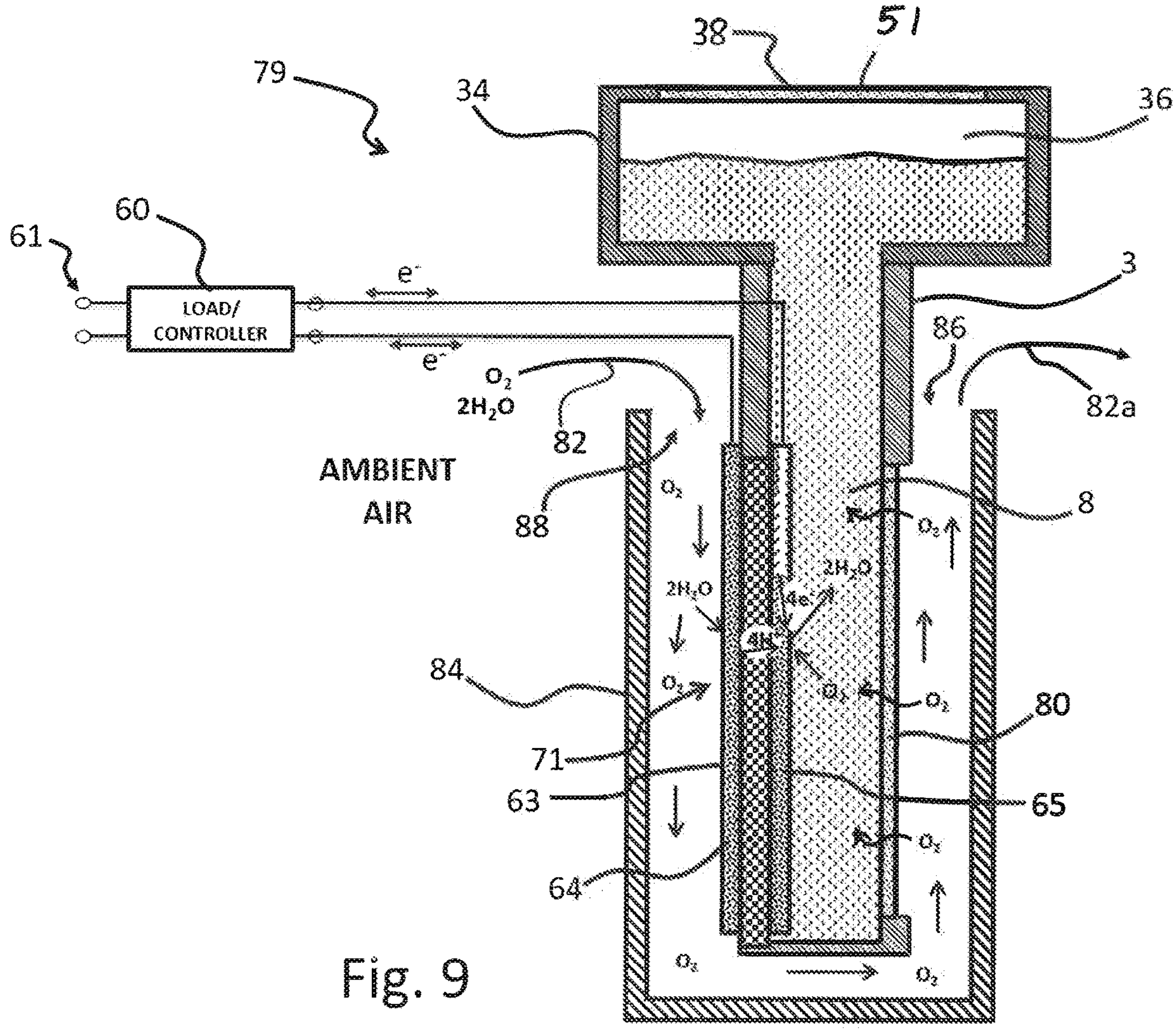
FIG. 9 is a schematic, cross-sectional view of an ambient energy converter in another preferred form of the invention.

With reference next to FIG. 9, there is shown an ambient energy converter 79 in another preferred from of the invention. Here, the ambient energy converter 79 is similar to that shown in FIG. 6 but also includes an air conduit 84 around the lower portion of the housing 3 containing the hygroscopic solution 8. The housing 3 also includes a porous hydrophobic membrane 80 comprising a portion of housing 3 opposite the membrane electrode assembly 71.

An air flow 82 through air conduit 84 may be promoted by forced or natural convention. The air flow 82 enters conduit 84 through port 88 and initially flows by membrane electrode 71, whereby water vapor is extracted from the air flow and absorbed into the hygroscopic solution 8, generating electrical power and consuming oxygen from the hygroscopic solution 8 in the process. The now dry air flows by porous hydrophobic membrane 80, whereby oxygen is free to be absorb into hygroscopic solution 8 to replenish oxygen consumed therefrom by hydrogen entering the solution through membrane electrode assembly 71. The now moisture depleted air 82*a* subsequently exits conduit 84 through port 86. Hydrophobic membrane 80 and air conduit 84 function as a coupling mechanism to supply oxygen to the hygroscopic solution 8.

Other mechanisms would also be suitable including oxygen injectors, bubblers or solution spray mechanisms. The device operates in reverse during conditions that promote evaporation of water from the hygroscopic solution as previously described. The humidity level of air entering conduit 84 would increases in humidity as it flows by membrane electrode assembly 71 with the evaporation of water from the solution. Similarly, additional oxygen will be released from the solution through membrane 80 into the air flow with a reduction of oxygen as water is oxidized with the conduction of protons through the membrane electrode assembly 71.

Figure 10:
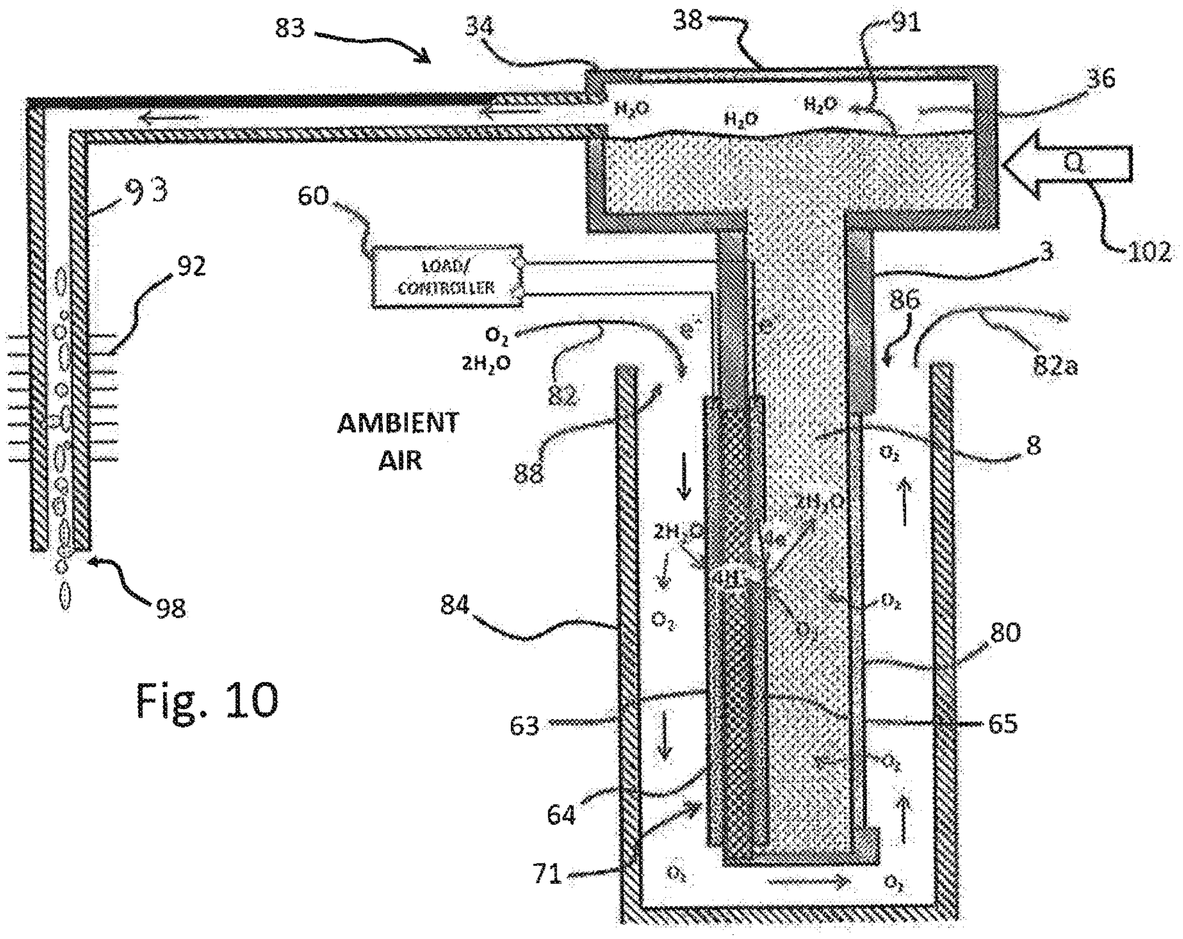
FIG. 10 is a schematic, cross-sectional view of an ambient energy converter in another preferred form of the invention.

With reference next to FIG. 10, there is shown an ambient energy converter 83 in another preferred from of the invention. Here, the ambient energy converter 83 is similar to that shown in FIG. 9; however, the ullage chamber 34 has a drip tube 93 coupled to a heat exchanger 92 which conveys water droplets 98 to ambience. The ambient energy converter 83 has an air conduit 84 around the lower portion of the housing 3 which contains hygroscopic solution 8. The housing 3 also includes a porous hydrophobic membrane 80 comprising a portion of housing 3 opposite the membrane electrode assembly 71. Air flow through conduit 84 may be promoted by forced or natural convention. Air flow 82 enters conduit 84 through port 88 and initially flows by membrane electrode 71, whereby water vapor is extracted and absorbed into hygroscopic solution 8, generating electrical power and consuming oxygen in solution 8 in the process. The now dry air flows pass porous hydrophobic membrane 80 whereby oxygen is free to absorb into solution 8 to replenish oxygen consumed therefrom by hydrogen entering the solution through membrane electrode assembly 71. The now moisture depleted air 82*a* subsequently exits conduit 84 through port 86. Membrane 80 and conduit 84 function as a coupling mechanism to supplying oxygen to the hygroscopic solution. Other mechanisms would also be suitable including oxygen injectors, bubblers or solution spray mechanisms. An additional heat source 102 supplies heat to continuously evaporate water from the hygroscopic solution 8 contained in the housing 3. The resulting water depleted hygroscopic solution 8 migrates down to the lower section of the housing 3 to reabsorb water and thereafter rise back up such that a continuous process of water extraction is maintained. This embodiment has the added benefit of being a source for supplying fresh water 98. Although the power density per unit area of MEA 71 is low because of impedance and $O_2$ activation energy, the efficiency is extremely high.

Figure 11:
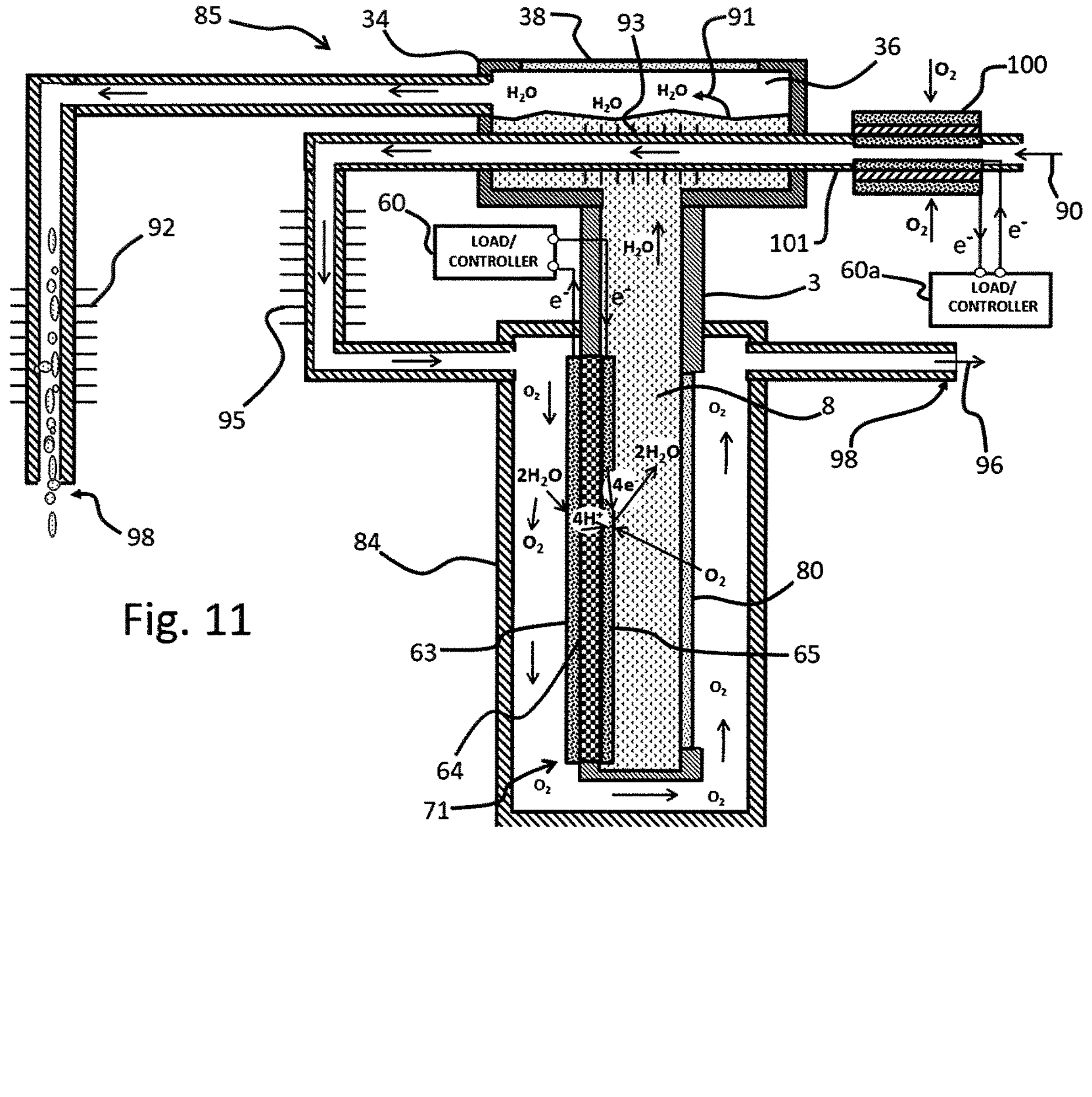
FIG. 11 is a schematic, cross-sectional view of an ambient energy converter in another preferred form of the invention.

With reference next to FIG. 11, there is shown an ambient energy converter 85 in another preferred from of the invention. Here, the ambient energy converter 85 includes a moisture latent exhaust flow or stream 90 passing through a hot air exhaust pipe or conduit 101. The exhaust pipe 101 passes the exhaust flow 90 through the interior of the air conduit 84. Such exhaust flow 90 may be supplied by as high temperature exhaust from a combustion engine or other combustion process. It may also be exhaust from an evaporative cooling tower or other source. In the event it is used in connection with engine exhaust, an oxygen ion conductive membrane electrode assembly 100 is included to operate on the oxygen partial pressure differential between the oxygen depleted combustion exhaust and ambient air. The power generated by oxygen ion conductive membrane electrode assembly 100 as it conducts oxygen into flow stream 90 under the oxygen partial pressure differential is supplied to load controller 60*a*.

Voltage is generated across the MEA 71 due to the oxygen pressure differential and the converter's temperature. The resulting power is supplied to load controller 60. The now oxygen replenished exhaust flows through heat exchanger 93 wherein heat of evaporation is transferred to hygroscopic solution 8 to evaporate water therefrom. The resulting water vapor is coupled to ambient air temperature by heat exchanger 92 which causes it to condense, as illustrated by water droplets 98. The now cooled exhaust 90 passes through heat exchanger 95 where it is further cooled by thermal coupling to ambient air before passing into conduit 84.

Moisture latent exhaust flow 90 enters conduit 84 and flows by membrane electrode assembly 71, whereby water vapor is extracted and absorbed into hygroscopic solution 8, generating electrical power and consuming oxygen from the hygroscopic solution 8 in the process. The now dry exhaust flow 90 then flows pass porous hydrophobic membrane 80 whereby oxygen is free to be absorbed into the hygroscopic solution 8 to replenish oxygen consumed by hydrogen entering the hygroscopic solution 8 through membrane electrode assembly 71. The now cooled, moisture depleted exhaust flow 96 subsequently exits conduit 84 through port 98. Membrane 80 and conduit 84 function as a dry air coupling mechanism to supplying oxygen to the hygroscopic solution. Other mechanisms would also be suitable including oxygen injectors, bubblers or solution spray mechanisms. Heat exchanger 93 functions as a heat source within reservoir or chamber 34 for evaporating water out of solution 8.

Figure 12:
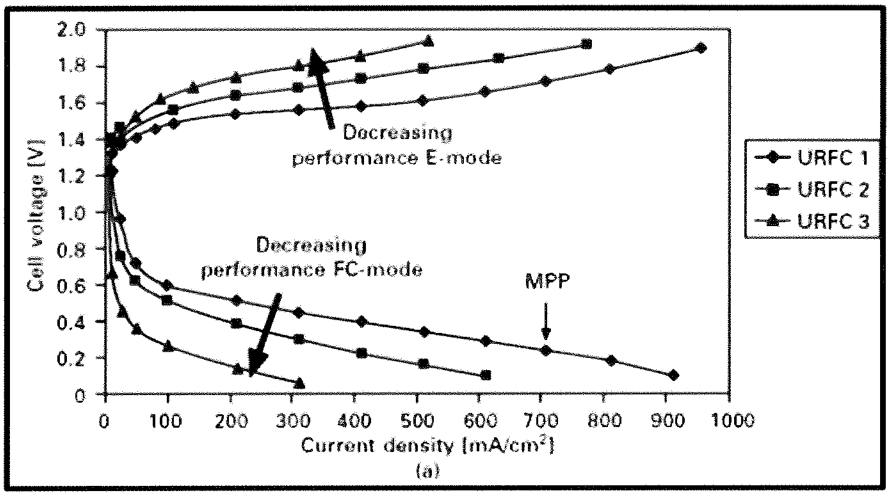
FIG. 12 is a graph illustrating the cell voltage vs the current density for water electrolyzing and reduction reactions in fuel cell membrane electrode assemblies.

As illustrated by FIG. 12, the electrochemical potential for the oxidation of water into protons and oxygen ion is equal to the potential for reducing the protons and oxygen ions to water, 1.23V. Because of the 0.4V activation energy thresholds of both the oxidation reaction and the reduction reaction, the output current will be very dependent on catalyst activity to approximation reversable processes resulting in net power output. As current draw increases the impedance and activation voltage losses for oxidizing and reducing water diverge from the open circuit voltage of the cell. That said, referring back to FIG. 11, at low current, the energy of condensation converted into electrical power of water entering the solution and would be almost equivalent to the of vaporization input to at heat exchanger 93 to evaporate the water back out of the solution. In an ideal system the heat input should be equal to the electrical power generated.

Figure 13:
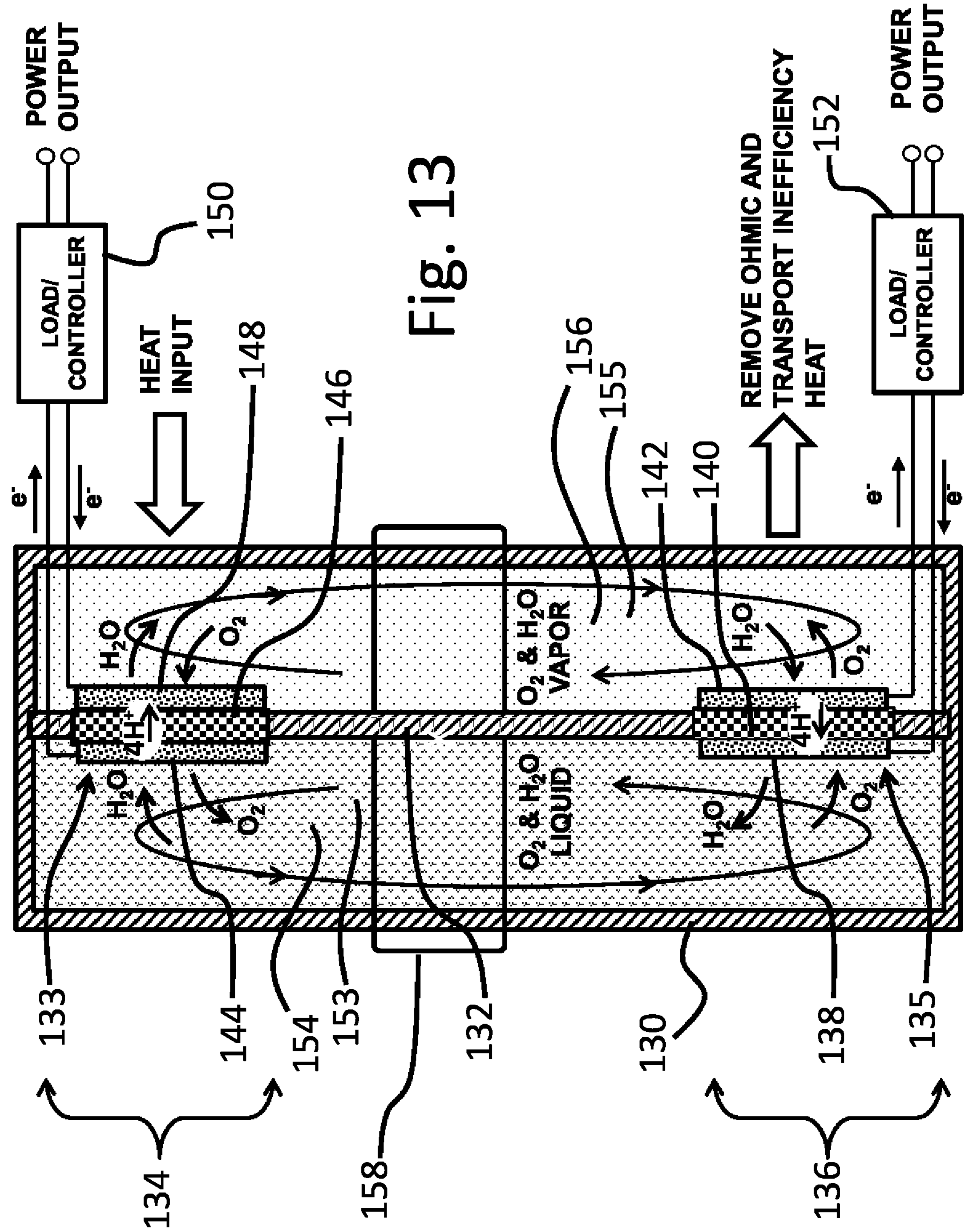
FIG. 13 is a schematic, cross-sectional view of an energy converter in another preferred form of the invention.

FIG. 13 illustrates an alternate embodiment of the invention. Here, a baffle 132 divides housing 130 into two chambers. A first chamber 153 contains first working fluid reactant material or low temperature hygroscopic solution 154 and a second chamber 155 contains second working fluid reactant material 156. It is configured having high temperature, heat input section 134 containing first membrane electrode assembly 133 comprising a first membrane 146 sandwiched between a first electrode 144 and a second electrode 148. It further includes a low temperature section 136 containing a second membrane electrode assembly 135 comprising a second membrane 140 sandwiched between a third electrode 138 and a fourth electrode 142. In one embodiment reactant material 154 may be a solution that decomposes via an endothermic reaction at elevated temperature and second working fluid reactant material 156 is a material that includes a decomposition constituent of material 154. Second membrane 140 and first membrane 146 are conductors of ions of the decomposition constituent. For example, reactant fluid 154 may be a hygroscopic solution of water ($H_2O$) and lithium bromide with dissolve oxygen and second working fluid reactant material 156 may be a mixture of water vapor ($H_2O$) and oxygen. In this case, second membrane 140 and first membrane 146 are conductors of hydrogen ions, protons.

Operation is such that heat of decomposition is input to heat input section 134. The higher vapor pressure of reactant fluid 154 causes water to evaporate therefrom at higher vapor pressure than the water vapor pressure inside second chamber 155. The vapor pressure differential causes oxidation of water at first electrode 144 with release of oxygen back into working reactant fluid 154. The resulting protons are conducted through first membrane 146 to second electrode 148 with electrical current being conducted through load 150 to second electrode 148 where they combine to form hydrogen, a decomposition constituent of reactant fluid (solution) 154. The hydrogen reacts with oxygen at second electrode 148 to reconstitute water vapor. The water vapor pressure within second chamber 155 is maintained lower than the water vapor pressure within high temperature, heat input section 134 of first chamber 153 by absorption reactions occurring at fourth electrode 142.

Low temperature hygroscopic solution 154 within low temperature section 136 attracts water vapor through second membrane electrode assembly 135 by way of oxidation reduction reactions. Water oxidation at fourth electrode 142 releases oxygen as protons, a decomposition constituent of reactant solution 154, are conducted through second membrane 140 to third electrode 138 with electrical current being conducted through load 152. The protons and electrons react with oxygen at third electrode 138 to reconstitute water within reactant solution 154, thereby reversing the decomposition reaction that occurred in first membrane electrode assembly 133.

Note that within first chamber 153 first electrode 144 and third electrode 138 are fluidically coupled to each other such that reaction products are interchanged between the two, oxygen is produced at first electrode 144 with consumption of water as oxygen is consumed at third electrode 138 with release of water such that the composition of reactant material (solution) 154 remains substantially constant. Similarly, within second chamber 155 the second electrode 148 and fourth electrode 142 are fluidically coupled to each other such that reaction products are interchanged between the two, oxygen is consumed at second electrode 148 with release of water as water is consumed at fourth electrode 142 with release of oxygen such that the composition fluid or fluid reactant material 156 within second chamber 155 remains substantially constant.

Alternate materials may be employed in the invention. One additional example would be a mixture of ammonia and water within first chamber 153 or just ammonia. Reactant material 156 would be hydrogen with second membrane 140 and first membrane 146 being proton conductors. In this case, ammonia would be decomposed in high temperature input section 134 of first chamber 153 with the decomposition constituent conducted through the membrane electrode assembly being hydrogen. Hydrogen is released into second chamber 155 through membrane electrode assembly 133 and nitrogen is released back into reactant material (solution) 154. Ammonia would be reconstituted at second membrane electrode assembly 135 with hydrogen passing therethrough and reacting with dissolved nitrogen contained in reactant material (solution) 154.

It should be understood that the systems described herein work on a reversable endothermic reaction as heat is supplied through a heat input. The reaction generates electrical power as the decomposition constituents of the first working fluid is conducted through the first membrane electrode assembly driven by the heat of decomposition. The second membrane electrode assembly is also generating electrical power by conducting the decomposition constituents from the second working fluid back to the first working fluid as the heat sink removes heat therefrom by reversing the decomposition reaction occurring through the first membrane electrode assembly.

It thus is seen that an ambient energy converter or electrochemical heat to electrical power converter is now provided which overcomes problems associated with prior art systems. While this invention has been described in detail with particular references to the preferred embodiments thereof, it should be understood that many modifications, additions and deletions, in addition to those expressly recited, may be made thereto without departure from the spirit and scope of the invention.

The invention claimed is:

1. A gas energy converter comprising:

a housing;

a mass of hygroscopic solution contained within said housing;

an ion conductive membrane electrode assembly coupled to said housing and in fluid communication with the mass of hygroscopic solution and a source of gas to facilitate an electrochemical oxidation reduction process that is equivalent to condensing and evaporating water to and from the mass of hygroscopic solution under the water vapor pressure differential between the mass of hygroscopic solution and the source of gas to generate electrical power, and a gas flow conduit at least partially positioned about said housing to direct a gas stream through said gas flow conduit in fluid communication with said ion conductive membrane electrode assembly and said hydrophobic membrane, said housing includes a hydrophobic membrane in fluid communication with the source of gas and the mass of hygroscopic solution, whereby the hydrophobic membrane allows permeation of oxygen between the mass of hygroscopic solution and the source of gas.

2. The gas energy converter of claim 1 wherein said ion conductive membrane electrode has a first electrode, a second electrode, an ion conductive member positioned between said first electrode and said second electrode, wherein the ion conductive member is a proton conductive member.

3. The gas energy converter of claim 1 wherein said ion conductive member is a proton conductive member having barrier properties to molecular water diffusion.

4. The gas energy converter of claim 2 wherein said ion conductive membrane electrode assembly also includes an ion conductive barrier mounted to said first electrode.

5. The gas energy converter of claim 1 wherein said housing includes a drip tube extending from a top portion of said housing.

6. The gas energy converter of claim 5 further comprising a heat exchanger thermally coupled to said drip tube.

7. The gas energy converter of claim 1 further comprising an air exhaust pipe passing through said housing in thermal contact with said hygroscopic solution and through said gas flow conduit.

8. The gas energy converter of claim 1 further comprising an oxygen ion conductive membrane electrode assembly coupled to said air exhaust pipe.

9. A gas energy converter comprising:

a housing having a hydrophobic membrane portion;

a mass of hygroscopic solution contained within said housing and in fluid communication with said hydrophobic membrane portion;

an ion conductive membrane electrode assembly coupled to said housing between a gas and the mass of hygroscopic solution to electrochemically generate electrical power with the passage of water through said ion conductive membrane electrode assembly, and a gas conduit at least partially positioned about said housing lower portion to direct the gas through said gas conduit in fluid communication with said ion conductive membrane electrode assembly.

10. The gas energy converter of claim 9 wherein said ion conductive membrane electrode has a first electrode, a second electrode, an ion conductive member positioned between said first electrode and said second electrode.

11. The gas energy converter of claim 10 wherein said ion conductive member is a proton conductive member.

12. The gas energy converter of claim 10 wherein said ion conductive membrane electrode is a barrier to molecular water migration.

13. The gas energy converter of claim 9 further comprising a gas conduit at least partially positioned about said housing lower portion to direct a gas stream through said gas conduit in fluid communication with said ion conductive membrane electrode assembly and said hydrophobic membrane portion.

14. The gas energy converter of claim 9 wherein said housing includes a drip tube extending from said housing top portion.

15. The gas energy converter of claim 14 further comprising a heat exchanger thermally coupled to said drip tube.

16. The gas energy converter of claim 13 further comprising an air exhaust pipe passing through said housing in thermal contact with said hygroscopic solution and through said gas conduit.

17. The gas energy converter of claim 16 further comprising an oxygen ion conductive membrane electrode assembly coupled to said air exhaust pipe.

18. The gas energy converter of claim 9 further comprising an ullage chamber for accommodating changes in volume of the hygroscopic solution.

* * * * *